United States Patent [19]

Beinvogl et al.

[11] Patent Number: 4,479,850
[45] Date of Patent: Oct. 30, 1984

[54] METHOD FOR ETCHING INTEGRATED SEMICONDUCTOR CIRCUITS CONTAINING DOUBLE LAYERS CONSISTING OF POLYSILICON AND METAL SILICIDE

[75] Inventors: Willy Beinvogl, Munich; Barbara Hasler, Stockdorf, both of Fed. Rep. of Germany

[73] Assignee: Siemens Aktiengesellschaft, Berlin & Munich, Fed. Rep. of Germany

[21] Appl. No.: 581,353

[22] Filed: Feb. 17, 1984

[30] Foreign Application Priority Data

Apr. 29, 1983 [DE] Fed. Rep. of Germany ....... 3315719

[51] Int. Cl.³ .................. H01L 21/306; B44C 25/06; C03C 15/00; C23F 1/02
[52] U.S. Cl. .................................. 156/643; 156/646; 156/652; 156/657; 156/659.1; 204/192 E; 252/79.1
[58] Field of Search ............... 156/643, 646, 652, 657, 156/659.1, 662, 656, 664; 204/192 E, 192 EC; 427/38, 39; 252/79.1; 430/313

[56] References Cited

U.S. PATENT DOCUMENTS 4,411,734 10/1983 Maa ..................................... 156/651
4,444,617 4/1984 Whitcomb .......................... 156/643

FOREIGN PATENT DOCUMENTS 15403 9/1980 European Pat. Off. .

OTHER PUBLICATIONS

"Refractory Silicides for Integrated Circuits", J. Vac. Sci. Techol., 17(4), Jul./Aug. 1980; pp. 775-792.
"Tantalum Silicide/Polycrystalline Silicon-High Conductivity Gates for CMOS LSI Applications"; J. Vac. Sci. Technol., 18(2), Mar. 1981; pp. 345 to 348.
"Molybdenum Etching Using CCl₄/O₂ Mixture Gas"; Japanese Journal of Applied Physics, Jan. 1982; pp. 168 to 172.

Primary Examiner—William A. Powell
Attorney, Agent, or Firm—Hill, Van Santen, Steadman & Simpson

[57] ABSTRACT

A method for etching a double layer semiconductor structure containing metal silicide layers or a metal silicide-polysilicon layer on a silicon substrate through a photoresist mask by means of reactive ion etching wherein dissociation and ionization of reactant gases take place in a plasma, the improvement which comprises:
 employing a mixture of chlorine gas and a highly reducing gas such as boron trichloride as the reactant gases.

10 Claims, 3 Drawing Figures

METHOD FOR ETCHING INTEGRATED SEMICONDUCTOR CIRCUITS CONTAINING DOUBLE LAYERS CONSISTING OF POLYSILICON AND METAL SILICIDE

BACKGROUND OF THE INVENTION

1. Field of the Invention

This invention is in the field of etching integrated semiconductor circuits by the reactive ion etching technique using an improved gas mixture as the etchant.

2. Description of the Prior Art

Metal silicides are enjoying increased significance in the manufacture of VLSI (very large scale integration) circuits utilizing MOS (metal-oxide-semiconductors). One of the applications for these circuits is that of a low resistance conducting track and gate material in a polysilicon gate process. The polysilicon is not generally replaced by the silicide completely but is rather augmented by it in such a way that the silicide is applied over a doped polysilicon layer. The creation of fine structures in such double layers is a complex etching problem since a series of boundary conditions must be taken into consideration in the manufacture of these circuits. These boundary conditions are:

(a) high selectivity to $SiO_2$, or to corresponding insulating layers since the ratio of layer thickness of polysilicide to $SiO_2$ can be up to 50:1, with very thin $SiO_2$ layers under the polysilicide;

(b) anisotropy of the etching with perpendicular edges, which is particularly important in VLSI circuits;

(c) employment of a photoresist as an etching mask, which frequently presents problems when using certain etching gases such as carbon tetrachloride;

(d) providing the possibility of buried contacts;

(e) achieving a good etching uniformity which is particularly important because of the so-called short channel effect; and (f) controlled etching times, so that high throughput is possible while the process is still subject to close quality control.

It is known from the prior art to etch structures containing polysilicides such as molybdenum and tungsten silicides. We know of only one brief suggestion regarding the etching of tantalum silicide structures which have considerable advantages over molybdenum and tungsten silicide structures because they have better temperature stability at high temperatures and good adhesion properties on polysilicon. This reference is in J.Vac.Sci.Technol. 17 (4) July/August 1980, pages 787–788. This reference suggests the etching of titanium, tantalum, molybdenum, and tungsten silicides in a plasma with a carbon tetrafluoride/oxygen mixture. The etchings are performed in part in a tunnel reactor and in part in a parallel plate reactor utilizing anodic coupling (see, in addition, J.Vac.Sci.Technol. 18 (2), March 1981, page 346). In principle, these layers can also be etched in the wet state but only with the loss of dimensions characteristic of wet-etching. It is characteristic of double layers that a multitude of edge shapes can appear during structuring, with only a few of the edge shapes being usable in circuit manufacture.

A number of methods for reactive ion etching of polysilicon are found in the European patent application 0 015 403 which suggests the utilization of gas mixtures consisting of sulfur hexafluoride ($SF_6$), chlorine ($Cl_2$), and an inert gas. With these methods, silicon is selectively etched whereby very good selectivity is achieved in the presence of $SiO_2$ and silicon nitride. In addition, a directional etching can also be carried out wherein the substrates to be etched are laid on the HF-carrying electrode, so that the generated depressions have perpendicular lateral walls and the etching mask does not project over the edge of the etched depressions.

Still another method of the type previously discussed is known for molybdenum etching from the Japanese Journal of Appl. Physics, Vol. 21, No. 1, January 1982, pages 168–172. In this method, a gas mixture of carbon tetrachloride ($CCl_4$) and oxygen is employed as the etching gas and a parallel plate reactor is operated with cathodic coupling.

SUMMARY OF THE INVENTION

The present invention provides an anisotropic etching process for dual layers consisting of metal silicide or metal silicide-polysilicon double layers wherein both a high selectivity to $SiO_2$ is achieved as well as the strict anisotropy required for the fabrication of VLSI circuits. Further, the etching times are adjustable such that high throughput is possible on the one hand, and, on the other hand, the process is readily controllable.

In the method according to the present invention, these objectives are achieved by combining chlorine gas in admixture with a highly reducing component and utilizing the mixture as the reactive gas in a reactive ion etching process. In such process, the reactive gases are introduced into a plasma where they undergo dissociation and ionization of the atoms of the reactant gas molecules.

In the particularly preferred form of the invention, boron trichloride ($BCl_3$) is added to the chlorine gas and the gas composition is adjusted such that the molecular ratio of the boron trichloride component to the chlorine component is less than 1:2.

The method of the present invention can be applied to all silicides of metals which are etchable in chlorine. For example, this includes titanium, molybdenum, and tantalum silicide. The process of the invention is preferably utilized for etching double layer structures consisting of tantalum silicide and polysilicon. The method, however, can also be applied to silicide single layers and to pure polysilicon layers alone.

One of the advantages of the present invention over known methods lies in the fact that it does not employ harmful carbon tetrachloride. This compound should be avoided as it is carcinogenic and can form phosgene, thereby requiring special care in its handling. The vapor pressure of carbon tetrachloride at room temperature is below 760 mTorr. In order to achieve adequate evaporation, the supply reservoir must be heated and this can lead to condensation in the valves. The employment of a gas mixture containing only chlorine, as is provided for in the present invention, also has advantages over the methods that use fluorine and chlorine in succession. A frequent experience in dry etching is that "memory effects" appear, thus complicating a reproducible process management. By "memory effect" is meant an influence on a process step by a preceding process step due, for example, to incomplete removal of chemical compounds from the reactor.

BRIEF DESCRIPTION OF THE DRAWINGS

A further description of the present invention will be made in conjunction with the attached sheet of drawings in which.

DESCRIPTION OF THE PREFERRED EMBODIMENTS

Figure 1:
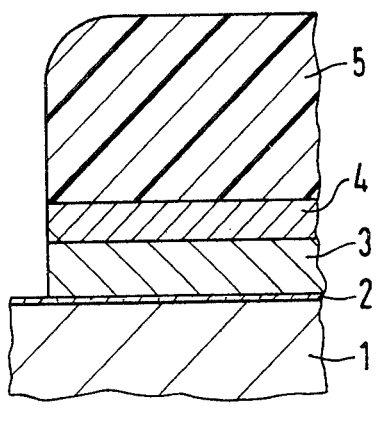
FIG. 1 is a fragmentary, greatly enlarged cross-sectional view of an integrated circuit structure over which a phototoresist mask is applied.
Figure 2:
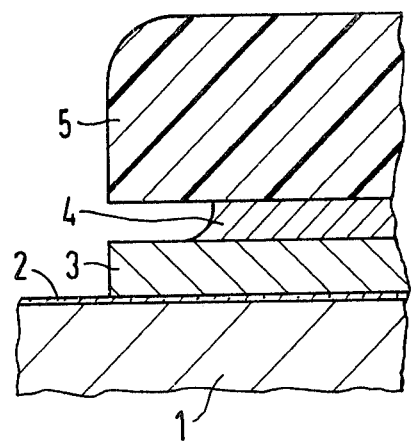
FIG. 2 is a view similar to FIG. 1 but illustrating the selective etching away of one of the layers of the semiconductor structure.

As seen in FIGS. 1 and 2, the gas composition of the present invention is decisive for the quality of etching. It is not possible to etch tantalum silicide with pure chlorine gas. The reason is probably that etching resistant oxide layers are formed at the surface of the silicide. An etching erosion is accomplished by means of admixing a highly reducing component to the chlorine gas such as boron trichloride which becomes $BCl_x$ in the plasma, where $x<3$. The boron trichloride component, however, must be relatively small since the silicide would otherwise be under-etched.

FIG. 1 shows an etching profile that was achieved with a gas composition of $BCl_3:Cl_2=2:5$. FIG. 2 shows an etching profile that was obtained with a gas composition $BCl_3:Cl_2=5:1$ at a higher pressure. In both Figures, the silicon substrate has been identified at reference numeral 1. A 40 nm thick $SiO_2$ layer is identified with reference numeral 2. A 300 nm thick n+-doped polysilicon layer is referred to at reference numeral 3, and a 200 nm thick tantalum silicide layer at reference numeral 4. Reference numeral 5 has been applied to a functioning photoresist mask.

It is particularly advantageous to dilute the reactive gases in the plasma with an inert gas, for example, helium. The amount of inert gas should be in excess, and typically the inert carrier gas should exceed twice the total molecular amount of $BCl_3$ and $Cl_2$. When a particularly high selectivity to $SiO_2$ is desired, for example, >30:1, $BCl_3$ is added to the $Cl_2$ only at the beginning of the etching and the etching process is finished in pure $Cl_2$. Typically, the first phase of the process utilizing both reactants is carried out for one-fifth of the total time, and the second phase in pure $Cl_2$ is carried out for the remainder of the time.

The gas pressure in the reactor must be sufficiently low and the bias voltage of the HF-carrying electrode must be high enough in order to enable a strictly anisotropic etching. Typically, the gas pressure can range from about 0.1 to 10 Pa and is usually at about 1.5 Pa (10 mTorr). The rf power density is on the order of 0.1 to 0.50 Watts/cm$^2$, and typically at 0.15 W/cm$^2$.

One advantage of the method is that the photoresist which may, for example, be a Shipley positive resist, can be employed as the etching mask so that additional auxiliary layers are not required.

Figure 3:
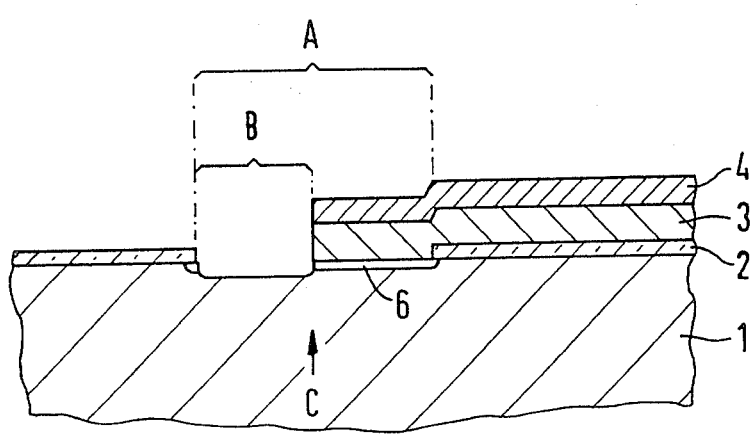
FIG. 3 is a fragmentary, greatly enlarged cross-sectional view of an integrated circuit structure with a buried contact manufactured by means of the method of the present invention.

In FIG. 3, the same reference characters used in FIGS. 1 and 2 also apply. One of the advantages of the present invention is that a $Cl_2$ plasma exhibits a highly doping-dependent etching rate. For n-doped polysilicon 3 under the conditions of the succeeding examples, n+-doped polysilicon etches about 6 times faster than undoped silicon. This is of practical significance in forming the so-called "buried" contact. When the polysilicon layer 3 is doped by means of diffusion, the substrate 1 is also p-doped in the region A at the surface 6. With a suitable process control, however, the penetration depth can be kept low (0.1 to 0.2 microns). The unavoidable incipient substrate etching in the region B during the structuring of the dual layers 3,4 is slight due to the aforesaid doping-dependency of the silicon etching rate. The creation of a high step illustrated by the arrow C and a potential deterioration of the electrical contact resistance in the buried contact as well as topographical problems can be avoided in the subsequent process steps as a result.

The following specific examples illustrate the procedures more completely.

EXAMPLE 1

Reactive ion etching was carried out in a single-stage process in a parallel plate reactor. The gas composition contained 5 molecular parts $Cl_2$, 2 molecular parts $BCl_3$, and 50 molecular parts He. The power applied was 0.15 W/cm$^2$. The pressure in the reaction vessel was kept as 1.5 Pa. The etching profile which resulted was strictly anisotropic and evidenced a selectivity to $SiO_2$ of about 15:1.

EXAMPLE 2

Reactive ion etching was carried out in a two-stage process. The first stage was carried out as described in Example 1 for approximately 1 minute. Then, etching was carried out without $BCl_3$ in the second stage, otherwise the conditions were similar to those in Example 1. Selectivity of etching to $SiO_2$ was thereby increased to 30:1 with a total etching time of 6 minutes for a 100 mm silicon wafer.

It should be evident that various modifications can be made to the described embodiments without departing from the scope of the present invention.

We claim as our invention:

1. In a method for etching a double layer semiconductor structure containing metal silicide layers or a metal silicide-polysilicon layer on a silicon substrate through a photoresist mask by means of reactive ion etching wherein dissociation and ionization of reactant gases take place in a plasma, the improvement which comprises:

employing a mixture of chlorine gas and a highly reducing gas as the reactant gases.

2. A method as claimed in claim 1 wherein:

said highly reducing gas is boron trichloride.

3. A method according to claim 2 wherein:

the molecular ratio of boron trichloride to chlorine in said mixture is less than 1:2.

4. A method according to claim 1 wherein said mixture also contains an inert carrier gas.

5. A method according to claim 4 wherein said inert carrier gas is helium.

6. A method according to claim 4 wherein the molecular ratio of chlorine to boron trichloride to carrier gas is about 5:2:50.

7. A method according to claim 1 wherein said double layer consists of layers of tantalum silicide and polysilicon.

8. A method according to claim 7 wherein said tantalum silicide layer has a thickness of about 200 nm and said polysilicon layer consists of an n+-doped layer of about 300 nm in thickness.

9. A method according to claim 4 wherein said etching is carried out in two stages, utilizing the chlorine-boron trichloride-inert gas mixture in the first stage for about 1/5 of the total etching time and utilizing only a chlorine-inert gas mixture in a second stage for the balance of the etching time.

10. A method according to claim 1 wherein the gas pressure during etching is about 1.5 Pa and the power level is about 0.15 W/cm$^2$.

* * * * *